(12) United States Patent
Yasukawa

(10) Patent No.: US 12,249,806 B2
(45) Date of Patent: *Mar. 11, 2025

(54) SEMICONDUCTOR LASER DRIVE DEVICE AND METHOD OF MANUFACTURING THE SAME

(71) Applicant: SONY SEMICONDUCTOR SOLUTIONS CORPORATION, Kanagawa (JP)

(72) Inventor: Hirohisa Yasukawa, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/414,180

(22) Filed: Jan. 16, 2024

(65) Prior Publication Data

US 2024/0154385 A1 May 9, 2024

Related U.S. Application Data

(63) Continuation of application No. 17/046,836, filed as application No. PCT/JP2019/009591 on Mar. 11, 2019, now Pat. No. 11,962,123.

(30) Foreign Application Priority Data

Apr. 19, 2018 (JP) ................................. 2018-080518

(51) Int. Cl.
*H01S 3/13* (2006.01)
*H01S 5/02345* (2021.01)
(Continued)

(52) U.S. Cl.
CPC ........ *H01S 5/0261* (2013.01); *H01S 5/02345* (2021.01); *H01S 5/026* (2013.01);
(Continued)

(58) Field of Classification Search
CPC .... H01S 5/0261; H01S 5/02345; H01S 5/026; H01S 5/0262
See application file for complete search history.

(56) References Cited

U.S. PATENT DOCUMENTS 7,061,949 B1    6/2006  Zhou et al.
11,962,123 B2*  4/2024  Yasukawa ........... H01S 5/02345
(Continued)

FOREIGN PATENT DOCUMENTS

CN        1497805 A         5/2004
CN       102403309          4/2012
(Continued)

OTHER PUBLICATIONS

International Search Report and Written Opinion for International (PCT) Patent Application No. PCT/JP2019/009591, dated Jun. 4, 2019, 5 pages.
(Continued)

*Primary Examiner* — Kinam Park
(74) *Attorney, Agent, or Firm* — Sheridan Ross PC

(57) ABSTRACT

In a semiconductor laser drive device, a wiring inductance in electrically connecting a semiconductor laser and a laser driver is reduced. The semiconductor laser drive device includes a substrate, the laser driver, and the semiconductor laser. The laser driver is built in the substrate. The semiconductor laser is mounted on one surface of the substrate of the semiconductor laser drive device. Connection wiring electrically connects the laser driver and the semiconductor laser by a wiring inductance of 0.5 nanohenries or less.

12 Claims, 14 Drawing Sheets

(51) Int. Cl.
*H01S 5/026* (2006.01)
*H01S 5/0235* (2021.01)
*H01S 5/042* (2006.01)
*H01S 5/0683* (2006.01)

(52) U.S. Cl.
CPC .......... *H01S 5/0262* (2013.01); *H01S 5/0235* (2021.01); *H01S 5/0425* (2013.01); *H01S 5/0683* (2013.01)

(56) References Cited

U.S. PATENT DOCUMENTS

| | | | |
|---|---|---|---|
| 2003/0034554 A1* | 2/2003 | Onitani | H01L 23/66 257/E23.062 |
| 2005/0158058 A1* | 7/2005 | Bae | G02F 1/015 398/182 |
| 2012/0140484 A1 | 6/2012 | Sander et al. | |
| 2013/0093046 A1* | 4/2013 | Bayerer | H01L 25/162 257/532 |
| 2013/0163627 A1 | 6/2013 | Seurin et al. | |
| 2014/0160745 A1* | 6/2014 | Mandelboum | H01S 5/02345 362/382 |
| 2014/0217570 A1 | 8/2014 | Hettler et al. | |
| 2014/0219302 A1 | 8/2014 | Canumalla et al. | |
| 2014/0327902 A1* | 11/2014 | Giger | G01S 17/08 356/5.01 |
| 2015/0380897 A1 | 12/2015 | Canumalla et al. | |
| 2017/0102508 A1* | 4/2017 | Yoda | G02B 6/4238 |
| 2017/0243860 A1* | 8/2017 | Hong | H01L 24/14 |
| 2018/0088213 A1* | 3/2018 | Morita | G01S 17/10 |
| 2018/0278011 A1* | 9/2018 | Galvano | G01S 7/4813 |
| 2020/0036156 A1* | 1/2020 | Wojcik | H01L 25/167 |
| 2020/0067270 A1* | 2/2020 | Müller | H01S 5/0236 |
| 2021/0143607 A1 | 5/2021 | Yasukawa | |

FOREIGN PATENT DOCUMENTS

| | | |
|---|---|---|
| CN | 103943574 | 7/2014 |
| CN | 103959086 | 7/2014 |
| CN | 106471686 | 3/2017 |
| EP | 2610978 | 7/2013 |
| JP | H09-307174 | 11/1997 |
| JP | H11-091165 | 4/1999 |
| JP | H11-238907 | 8/1999 |
| JP | 2001-339077 | 12/2001 |
| JP | 2002-232062 | 8/2002 |
| JP | 2002-359472 | 12/2002 |
| JP | 2003-060107 | 2/2003 |
| JP | 2003-249712 | 9/2003 |
| JP | 2004-031456 | 1/2004 |
| JP | 2004-241505 | 8/2004 |
| JP | 2005-203784 | 7/2005 |
| JP | 2011060875 A | 3/2011 |
| JP | 2012-060133 | 3/2012 |
| JP | 2014-138190 | 7/2014 |
| JP | 2016-507160 | 3/2016 |
| JP | 2018-054415 | 4/2018 |
| JP | 7329502 B2 | 8/2023 |
| KR | 10-2012-0026873 | 3/2012 |
| KR | 10-2017-0099025 | 8/2017 |
| WO | WO 2015/146377 | 10/2015 |
| WO | WO 2018/114812 | 6/2018 |
| WO | WO 2018/188910 | 10/2018 |

OTHER PUBLICATIONS

Official Action for U.S. Appl. No. 17/046,836, dated Aug. 17, 2023, 8 pages.
Notice of Allowance for U.S. Appl. No. 17/046,836, dated Dec. 12, 2023, 9 pages.

* cited by examiner a     OVERLAP: 0% b     OVERLAP: 50% c     OVERLAP: 100%

FIG. 4

ADDITIVE METHOD (H=15μm)

|   |   | L | | | | |
|---|---|---|---|---|---|---|
|   |   | 0.3mm | 0.5mm | 1mm | 2mm | 3mm |
| W | 0.015mm | 0.21 | 0.40 | 0.94 | 2.16 | 3.48 |
|   | 0.05mm | 0.16 | 0.33 | 0.79 | 1.85 | 3.02 |
|   | 0.1mm | 0.13 | 0.27 | 0.68 | 1.63 | 2.69 |
|   | 0.2mm | 0.09 | 0.21 | 0.56 | 1.39 | 2.33 |
|   | 0.3mm | 0.07 | 0.17 | 0.48 | 1.24 | 2.11 |

FIG. 5

SUBTRACTIVE METHOD (H=35μm)

|   |         | L      |        |       |      |      |
|---|---------|--------|--------|-------|------|------|
|   |         | 0.3mm  | 0.5mm  | 1mm   | 2mm  | 3mm  |
| W | 0.035mm | 0.16   | 0.32   | 0.77  | 1.82 | 2.98 |
|   | 0.05mm  | 0.15   | 0.30   | 0.73  | 1.75 | 2.86 |
|   | 0.1mm   | 0.12   | 0.25   | 0.65  | 1.57 | 2.59 |
|   | 0.2mm   | 0.09   | 0.20   | 0.54  | 1.35 | 2.27 |
|   | 0.3mm   | 0.07   | 0.17   | 0.47  | 1.22 | 2.07 | a b c d e f e

INTERLAYER INSULATING RESIN
161 f

VIA HOLE 170 g

INTERLAYER INSULATING RESIN
162 h j j k l m n

SEMICONDUCTOR LASER DRIVE DEVICE AND METHOD OF MANUFACTURING THE SAME

CROSS REFERENCE TO RELATED APPLICATIONS

This application is a continuation of U.S. patent application Ser. No. 17/046,836, filed Oct. 12, 2020, which is a national stage application under 35 U.S.C. 371 and claims the benefit of PCT Application No. PCT/JP2019/009591 having an international filing date of Mar. 11, 2019, which designated the United States, which PCT application claimed the benefit of Japanese Patent Application No. 2018-080518 filed Apr. 19, 2018, the entire disclosures of each of which are incorporated herein by reference.

TECHNICAL FIELD

The present technology relates to a semiconductor laser drive device. More specifically, the present technology relates to a semiconductor laser drive device including a substrate having a laser driver built-in and a semiconductor laser, and a method of manufacturing the same.

BACKGROUND ART

Conventionally, a distance measuring method called time of flight (ToF) method is well known in electronic devices having a distance measuring function. The ToF is a method in which a light emitting unit irradiates an object with irradiation light of sine waves or rectangular waves, a light-receiving unit receives reflected light from the object, and a distance measurement and calculation unit measures a distance from a phase difference between the irradiation light and the reflected light. To implement such a distance measuring function, an optical module is known, in which a light emitting element and an electronic semiconductor chip for driving the light emitting element are housed and integrated in a case. For example, an optical module provided with a laser diode array arrayed and mounted on an electrode pattern of a substrate, and a driver IC electrically connected to the laser diode array has been proposed (for example, see Patent Document 1).

CITATION LIST

Patent Document

Patent Document 1: Japanese Patent Application Laid-Open No. 2009-170675

SUMMARY OF THE INVENTION

Problems to be Solved by the Invention

In the above-described conventional technology, the laser diode array and the driver IC are integrally configured as the optical module. However, in the conventional technology, the laser diode array and the driver IC are electrically connected by a plurality of wires, and a wiring inductance therebetween becomes large, and a drive waveform of the semiconductor laser may be distorted. This is a particular problem in ToF in which a semiconductor laser drive device is driven at several hundreds of megahertz.

The present technology has been created in view of the foregoing, and aims to reduce a wiring inductance between a semiconductor laser and a laser driver in the semiconductor laser drive device.

Solutions to Problems

The present technology has been made to solve the above-described problem, and the first aspect thereof is a semiconductor laser drive device including: a substrate having a laser driver built-in; a semiconductor laser mounted on one surface of the substrate; and connection wiring configured to electrically connect the laser driver and the semiconductor laser by a wiring inductance of 0.5 nanohenries or less, and an electronic device including the semiconductor laser drive device. This brings about an effect of electrically connecting the laser driver and the semiconductor laser by a wiring inductance of 0.5 nanohenries or less.

Furthermore, in the first aspect, the connection wiring desirably has a length of 0.5 millimeters or less. Furthermore, the connection wiring has more favorably a length of 0.3 millimeters or less.

Furthermore, in the first aspect, the connection wiring may be provided via a connection via provided in the substrate. This brings about an effect of shortening the wiring length.

Furthermore, in the first aspect, a part of the semiconductor laser may be arranged over the laser driver. Furthermore, in the first aspect, a part of the semiconductor laser, the part having an area of 50% or less of the semiconductor laser, may be arranged over the laser driver.

Furthermore, in the first aspect, the substrate may include a thermal via at a position where the semiconductor laser is mounted. This brings about an effect of promoting heat dissipation.

Furthermore, in the first aspect, an outer wall surrounding a region including the semiconductor laser in the one surface of the substrate, and a diffusion plate covering an upper region of the region surrounded by the outer wall may be further included.

Furthermore, in the first aspect, a photodiode mounted on the one surface of the substrate and configured to monitor light intensity of laser light emitted from the semiconductor laser may be further included. This brings about an effect of maintaining an output of the semiconductor laser constant.

Furthermore, in the first aspect, a connection terminal to be connected with an outside on an opposite surface of the one surface of the substrate may be further included. This brings about an effect of ensuring the connection with the outside. In this case, the connection terminal may be formed by at least one of a solder ball, a copper core ball, a copper pillar bump, or a land grid array.

Furthermore, the second aspect of the present technology is a method of manufacturing a semiconductor laser drive device, the method including: a procedure of forming a laser driver on an upper surface of a support plate; a procedure of forming connection wiring of the laser driver to form a substrate having the laser driver built-in; and a procedure of mounting a semiconductor laser on one surface of the substrate and forming connection wiring that electrically connects the laser driver and the semiconductor laser by a wiring inductance of 0.5 nanohenries or less via the connection wiring. This brings about an effect of manufacturing the semiconductor laser drive device electrically connecting the laser driver and the semiconductor laser by a wiring inductance of 0.5 nanohenries or less.

Effects of the Invention

According to the present technology, a semiconductor laser drive device can exert an excellent effect of reducing a wiring inductance between a semiconductor laser and a laser driver. Note that the effects described here are not necessarily limited, and any of effects described in the present disclosure may be exhibited.

BRIEF DESCRIPTION OF DRAWINGS

FIG. 4 is a diagram illustrating numerical value examples of a wiring inductance with respect to a wiring length L and a wiring width W in a case of forming a wiring pattern by an additive method.

FIG. 5 is a diagram illustrating numerical value examples of the wiring inductance with respect to the wiring length L and the wiring width W in a case of forming a wiring pattern by a subtractive method.

MODE FOR CARRYING OUT THE INVENTION

Hereinafter, modes for implementing the present technology (hereinafter referred to as embodiments) will be described. Description will be given according to the following order.

1. Embodiment (Semiconductor Laser Drive Device)
2. Application (Electronic Device)

1. Embodiment

Semiconductor Laser Drive Device

Figure 1:
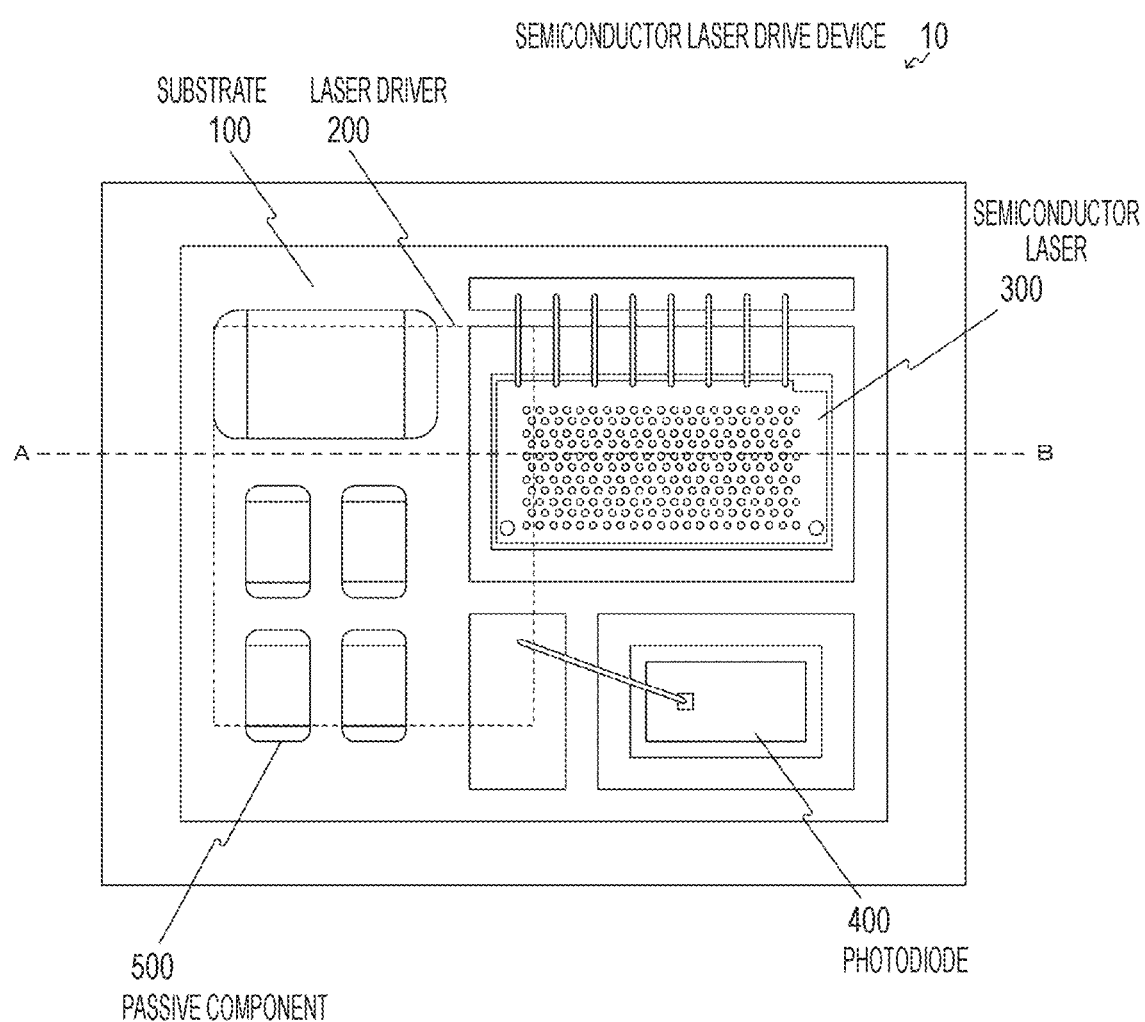
FIG. 1 is a view illustrating an example of a top view of a semiconductor laser drive device 10 according to an embodiment of the present technology.

FIG. 1 is a view illustrating an example of a top view of a semiconductor laser drive device 10 according to an embodiment of the present technology.

The semiconductor laser drive device 10 is assumed to measure a distance by ToF. ToF has characteristics of high depth accuracy though not so much as structured light and of being operable without difficulty even in a dark environment. In addition, ToF has many advantages in terms of simplicity of a device configuration, cost, and the like, compared to other methods such as structured light and stereo camera.

In the semiconductor laser drive device 10, a semiconductor laser 300, a photodiode 400, and a passive component 500 are electrically connected and mounted by wire bonding on a surface of a substrate 100 having a laser driver 200 built-in. A printed wiring board is assumed as the substrate 100.

The semiconductor laser 300 is a semiconductor device that causes a current to flow through a PN junction of a compound semiconductor to emit laser light. Here, as the compound semiconductor to be used, aluminum gallium arsenide (AlGaAs), indium gallium arsenide phosphide (InGaAsP), aluminum gallium indium phosphide (AlGaInP), gallium nitride (GaN), or the like is assumed, for example.

The laser driver 200 is a driver integrated circuit (IC) for driving the semiconductor laser 300. The laser driver 200 is built in the substrate 100 in a face-up state. Regarding the electrical connection with the semiconductor laser 300, it is desirable to make a wiring length as short as possible because the wiring inductance needs to be reduced. A specific numerical value will be described below.

The photodiode 400 is a diode for detecting light. The photodiode 400 is used for automatic power control (APC control) for monitoring light intensity of the semiconductor laser 300 and keeping output of the semiconductor laser 300 constant.

The passive component 500 is a circuit component other than active elements such as capacitors and resistors. The passive component 500 includes a decoupling capacitor for driving the semiconductor laser 300.

Figure 2:
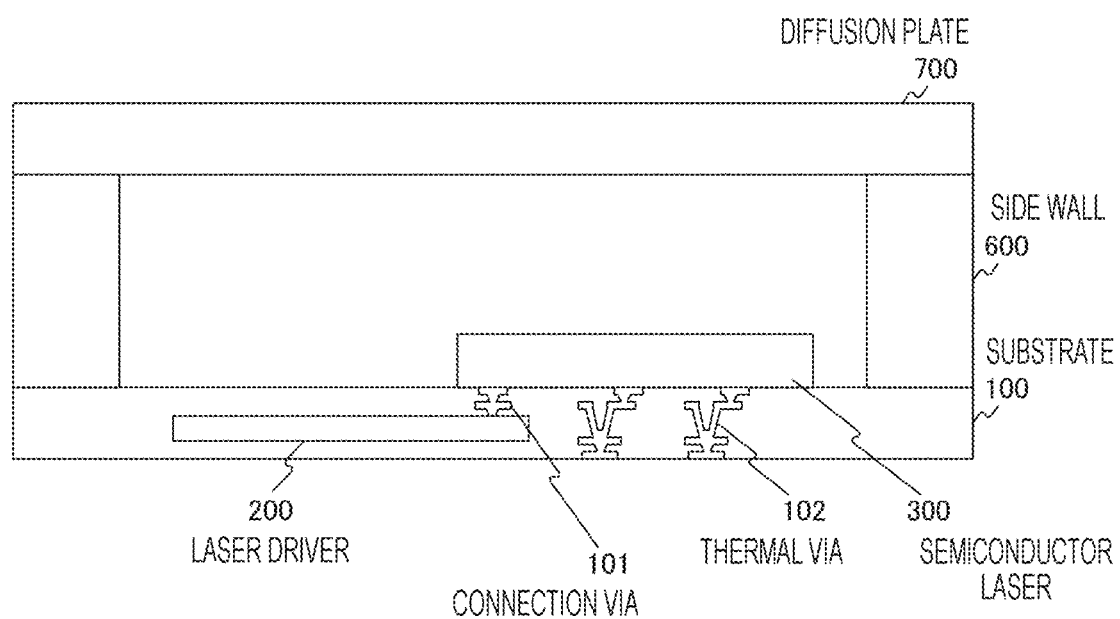
FIG. 2 is a view illustrating an example of a cross-sectional view of the semiconductor laser drive device 10 according to the embodiment of the present technology.

FIG. 2 is a view illustrating an example of a cross-sectional view of the semiconductor laser drive device 10 according to the embodiment of the present technology.

As described above, the substrate 100 has the laser driver 200 built-in, and the semiconductor laser 300 and the like are mounted on the surface of the substrate 100. Connection between the semiconductor laser 300 and the laser driver 200 is performed via a connection via 101. By using the connection via 101, the wiring length can be shortened. Note that the connection via 101 is an example of connection wiring described in the claims.

Furthermore, the substrate 100 includes a thermal via 102 for heat dissipation. Each component mounted on the substrate 100 is a heat source. By using the thermal via 102, heat generated in each component can be radiated from a back surface of the substrate 100.

The semiconductor laser 300, the photodiode 400, and the passive component 500 mounted on the surface of the substrate 100 are surrounded by a side wall 600. As the material of the side wall 600, a plastic material or a metal is assumed, for example.

An upper surface surrounded by the side wall 600 is covered with a diffusion plate 700. The diffusion plate 700 is an optical element for diffusing laser light from the semiconductor laser 300 and is also called a diffuser.

Figure 3:
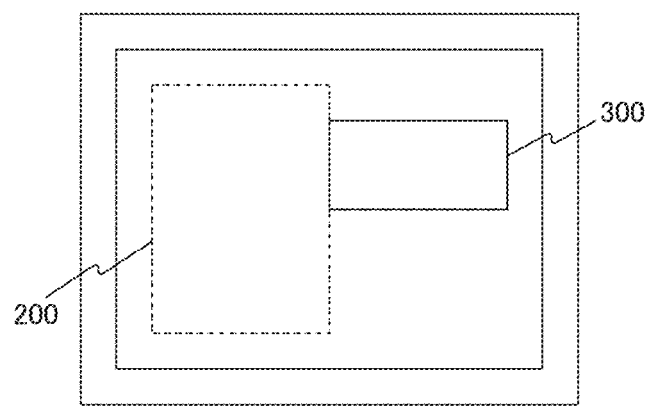
FIG. 3 is views illustrating a definition of an overlap amount between a laser driver 200 and a semiconductor laser 300 according to the embodiment of the present technology.
Figure 3:
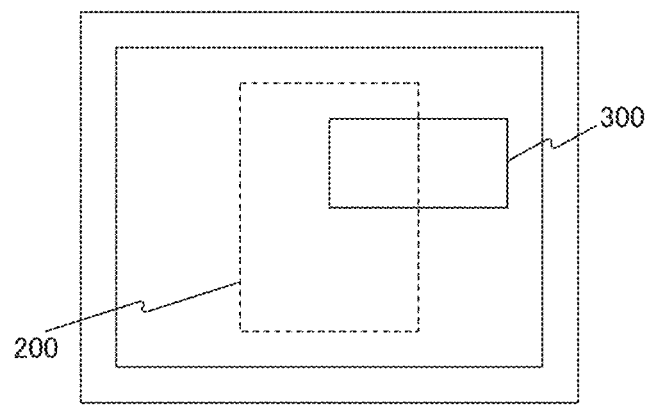
Figure 3:
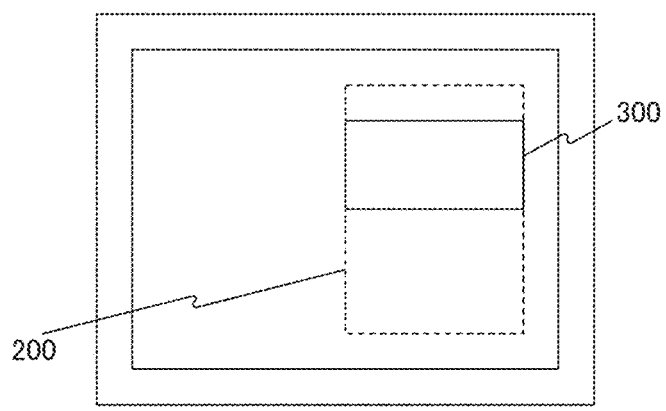

FIG. 3 is views illustrating a definition of an overlap amount between the laser driver 200 and the semiconductor laser 300 according to the embodiment of the present technology.

As described above, since the connection between the semiconductor laser 300 and the laser driver 200 is assumed to be performed via the connection via 101, the semiconductor laser 300 and the laser driver 200 are arranged to overlap when viewed from the upper surface. Meanwhile, it is desirable to provide the thermal via 102 in a lower surface of the semiconductor laser 300, and a region therefor needs to be secured. Therefore, to clarify the positional relationship between the laser driver 200 and the semiconductor laser 300, the overlap amount between the laser driver 200 and the semiconductor laser 300 is defined as follows.

In the arrangement illustrated in a in FIG. 3, no overlapping region is present between the semiconductor laser 300 and the laser driver 200 when viewed from the upper surface. The overlap amount in this case is defined as 0%. Meanwhile, in the arrangement illustrated in c in FIG. 3, the entire semiconductor laser 300 overlaps with the laser driver 200 when viewed from the upper surface. The overlap amount in this case is defined as 100%.

Then, in the arrangement illustrated in b in FIG. 3, a half region of the semiconductor laser 300 overlaps with the laser driver 200 when viewed from the upper surface. The overlap amount in this case is defined as 50%.

In the present embodiment, the overlap amount is desirably larger than 0% in order to provide a region for the above-described connection via 101. Meanwhile, considering that a certain number of the thermal vias 102 are arranged immediately below the semiconductor laser 300, the overlap amount is desirably 50% or less. Therefore, by setting the overlap amount to be larger than 0% and to be 50% or less, the wiring inductance can be made small and favorable heat dissipation characteristics can be obtained.

Wiring Inductance

As described above, in the connection between the semiconductor laser 300 and the laser driver 200, the wiring inductance is the problem. All conductors have an inductive component, and even an inductance of a very short lead may be detrimental in a high-frequency region of such a ToF system. That is, at high-frequency operation, a drive waveform for driving the semiconductor laser 300 from the laser driver 200 may be distorted due to the influence of the wiring inductance, and the operation may become unstable.

Here, a theoretical formula for calculating the wiring inductance is examined. For example, an inductance IDC [μH] of a straight lead wire having a circular cross section with a length L [mm] and a radius R [mm] is expressed by the following expression in free space. Note that ln represents a natural logarithm.

$$IDC=0.0002L \cdot (\ln(2L/R)-0.75)$$

Furthermore, for example, the inductance IDC [μH] of a strip line (substrate wiring pattern) having a length L [mm], a width W [mm], and a thickness H [mm] is expressed by the following expression in free space.

$$IDC=0.0002L \cdot (\ln(2L/(W+H))+0.2235((W+H)/L)+0.5)$$

FIGS. 4 and 5 are tables illustrating trial calculations of the wiring inductance [nH] between the laser driver built in the printed wiring board and the semiconductor laser electrically connected to an upper portion of the printed wiring board.

FIG. 4 is a diagram illustrating numerical value examples of the wiring inductance with respect to the wiring length L and the wiring width W in a case of forming a wiring pattern by an additive method. The additive method is a method of forming a pattern by depositing copper only on a necessary portion of an insulating resin surface.

FIG. 5 is a diagram illustrating numerical value examples of the wiring inductance with respect to the wiring length L and the wiring width W in a case of forming a wiring pattern by a subtractive method. The subtractive method is a method of forming a pattern by etching an unnecessary portion of a copper clad laminate.

In the case of the semiconductor laser drive device such as the ToF system, the wiring inductance is desirably 0.5 nH or less, and more favorably 0.3 nH or less, assuming that the semiconductor laser drive device is driven at several hundreds of megahertz. Therefore, considering the above-described trial calculation results, it is considered that the wiring length between the semiconductor laser 300 and the laser driver 200 is desirably 0.5 millimeters or less, and more favorably 0.3 millimeters or less.

Manufacturing Method

Figure 6:
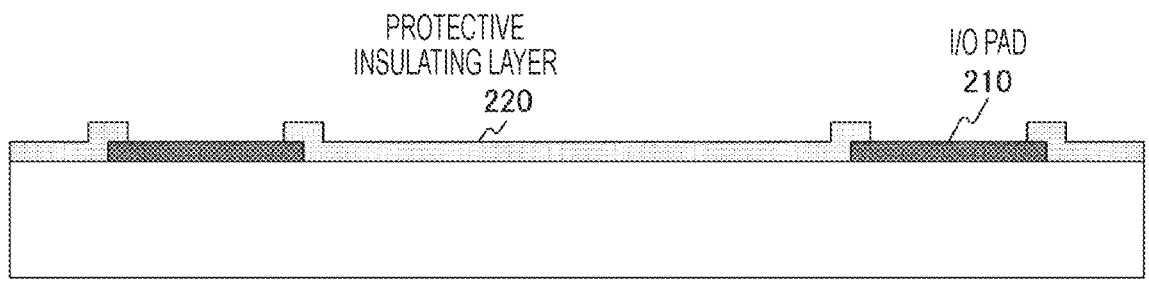
FIG. 6 is first views illustrating an example of steps of processing a copper land and a copper wiring layer (RDL) in a process of manufacturing the laser driver 200 according to the embodiment of the present technology.
Figure 6:
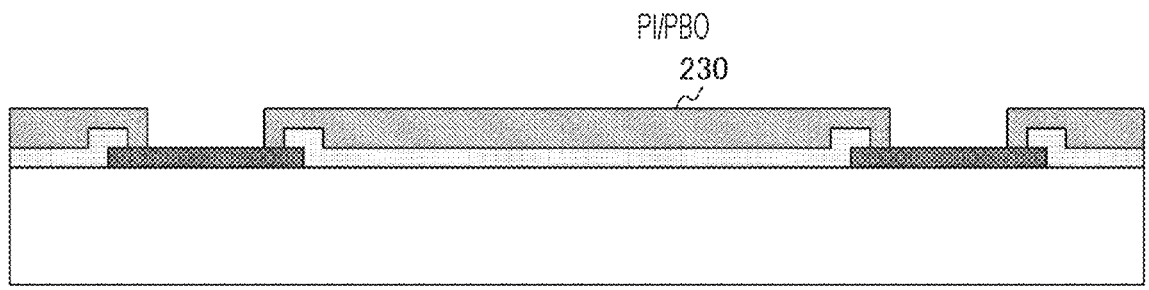
Figure 6:
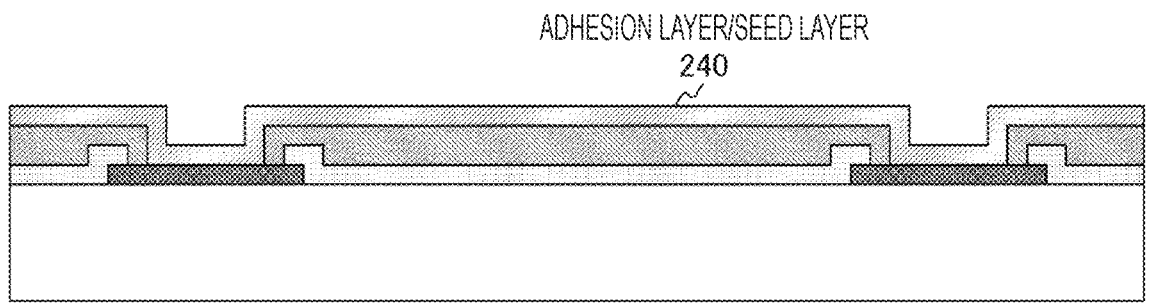
Figure 7:
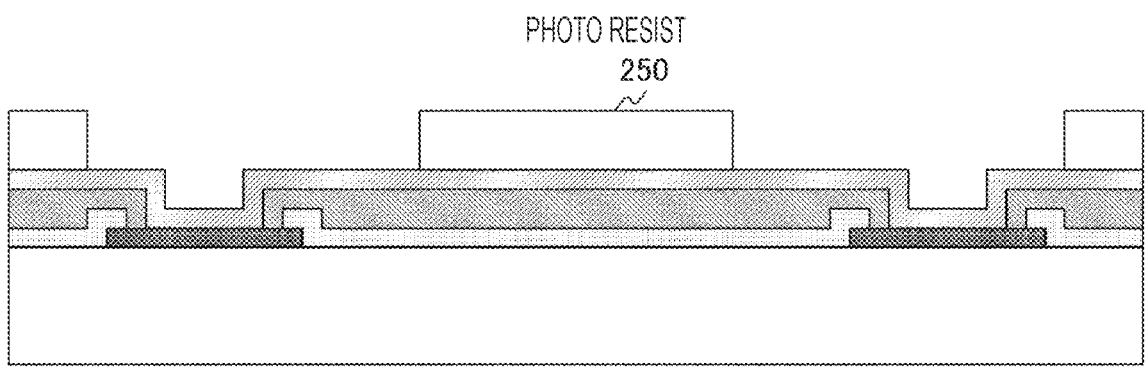
FIG. 7 is second views illustrating an example of steps of processing a copper land and a copper wiring layer (RDL) in the process of manufacturing the laser driver 200 according to the embodiment of the present technology.
Figure 7:
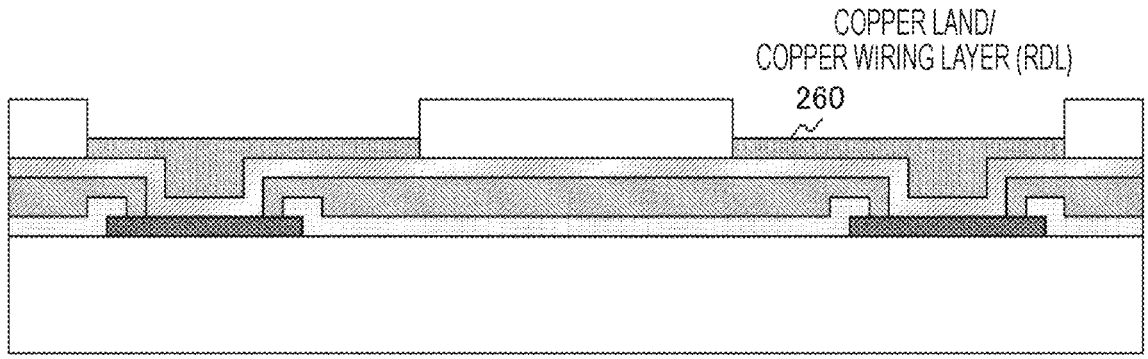
Figure 7:
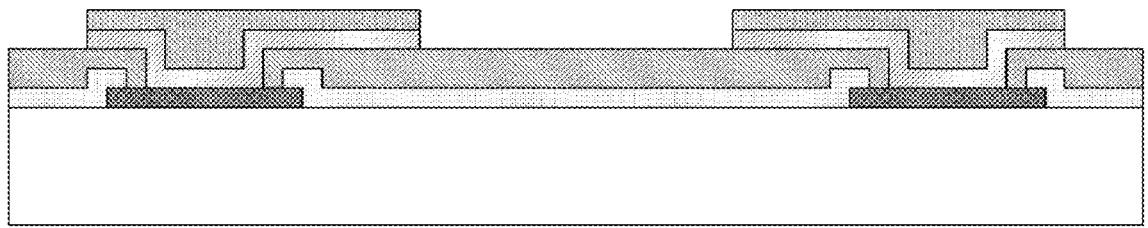

FIGS. 6 and 7 are views illustrating an example of steps of processing a copper land and a copper wiring layer (redistribution layer (RDL)) in the process of manufacturing the laser driver 200 according to the embodiment of the present technology.

First, as illustrated in a in FIG. 6, an I/O pad 210 formed using, for example, aluminum is formed on a semiconductor wafer. Then, a protective insulating layer 220 such as SiN is formed on a surface, and a region of the I/O pad 210 is opened.

Next, as illustrated in b in FIG. 6, a surface protective film 230 formed using polyimide (PI) or polybenzoxazole (PBO) is formed, and a region of the I/O pad 210 is opened.

Next, as illustrated in c in FIG. 6, titanium tungsten (TiW) having a thickness of several tens to 100 nm and copper (Cu) having a thickness of 100 to 1000 nm are continuously sputtered to form an adhesion layer and a seed layer 240. Here, as the adhesion layer, high melting point metal such as chromium (Cr), nickel (Ni), titanium (Ti), titanium copper (TiCu), or platinum (Pt) or its alloy may be applied, other than titanium tungsten (TiW). Furthermore, as the seed layer, nickel (Ni), silver (Ag), gold (Au), or its alloy may be applied, other than copper (Cu).

Next, as illustrated in d in FIG. 7, a photoresist 250 is patterned in order to form a copper land and a copper wiring layer for electrical connection. Specifically, the photoresist 250 is formed by steps of surface cleaning, resist coating, drying, exposure, and development.

Next, as illustrated in e in FIG. 7, a copper land and copper wiring layer (RDL) 260 for electrical connection is formed on the adhesion layer and the seed layer 240 by a plating method. Here, as the plating method, for example, an electrolytic copper plating method, an electrolytic nickel plating method, or other method can be used. Furthermore, the diameter of the copper land is desirably about 50 to 100 micrometers, the thickness of the copper wiring layer is desirably about 3 to 10 micrometers, and the minimum width of the copper wiring layer is desirably about 10 micrometers.

Next, as illustrated in f in FIG. 7, the photoresist 250 is removed, and the copper land and copper wiring layer (RDL) 260 of the semiconductor chip is masked and dry-etched. Here, for the dry etching, ion milling for emitting an argon ion beam can be used, for example. By the dry etching, the adhesion layer and the seed layer 240 in an unnecessary region can be selectively removed, and the copper land and the copper wiring layer are separated. Note that the unnecessary region can be removed by wet etching with aqua regia, or an aqueous solution of ceric ammonium nitrate, potassium hydroxide, or the like but dry etching is desirable considering side etching and thickness reduction of a metal layer constituting the copper land and the copper wiring layer.

FIGS. 8 to 12 are views illustrating an example of steps of manufacturing the substrate 100 according to the embodiment of the present technology.

Figure 8:
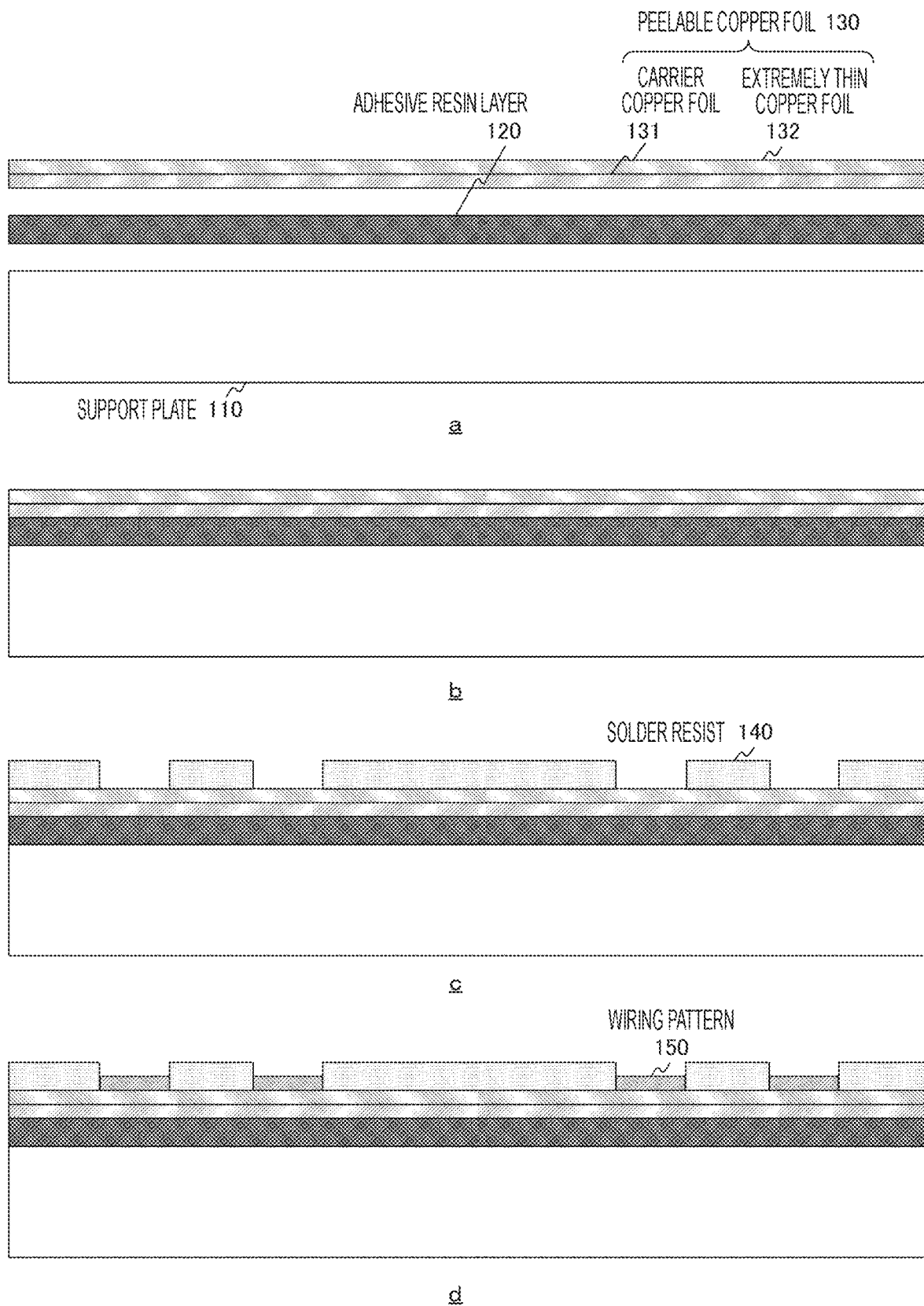
FIG. 8 is first views illustrating an example of steps of manufacturing a substrate 100 according to the embodiment of the present technology.

First, as illustrated in a in FIG. 8, a peelable copper foil 130 having a two-layer structure of an ultra-thin copper foil 132 and a carrier copper foil 131 is thermally bonded by roll laminating or laminating press on one side of a support plate 110 via an adhesive resin layer 120.

As the support plate 110, a substrate formed using an inorganic material, a metal material, a resin material, or the like can be used. For example, silicon (Si), glass, ceramic, copper, a copper alloy, aluminum, an aluminum alloy, stainless steel, a polyimide resin, or an epoxy resin can be used.

As the peelable copper foil 130, a copper foil obtained by vacuum-bonding the carrier copper foil 131 having the thickness of 18 to 35 micrometers to the ultra-thin copper foil 132 having the thickness of 2 to 5 micrometers each other. As the peelable copper foil 130, 3FD-P3/35 (manufactured by Furukawa Circuit Foil Co., Ltd.), MT-18S5DH (manufactured by Mitsui Mining & Smelting Co., Ltd.), or the like can be used, for example.

As the resin material of the adhesive resin layer 120, an organic resin such as an epoxy resin, a polyimide resin, a PPE resin, a phenol resin, a PTFE resin, a silicon resin, a polybutadiene resin, a polyester resin, a melamine resin, a urea resin, a PPS resin, or a PPO resin, which contains glass fiber reinforcing material, can be used. Furthermore, as the reinforcing material, aramid non-woven fabric, aramid fiber, polyester fiber, or the like can be used other than glass fiber.

Next, as illustrated in b in FIG. 8, a plating base conductive layer (not illustrated) having the thickness of 0.5 to 3 micrometers is formed on the surface of the ultra-thin copper foil 132 of the peelable copper foil 130 by electroless copper plating treatment. Note that the electroless copper plating treatment is to form a base conductive layer of electrolytic copper plating for forming a wiring pattern next. Note that the electroless copper plating treatment may be omitted, and an electrode for electrolytic copper plating may be directly brought in contact with the peelable copper foil 130, and electrolytic copper plating treatment may be directly applied on the peelable copper foil 130 to form a wiring pattern.

Next, as illustrated in c in FIG. 8, a photosensitive resist is attached to the surface of the support plate by roll laminating to form a resist pattern for the wiring pattern (solder resist 140). As the photosensitive resist, for example, a dry film plating resist can be used.

Next, as illustrated in d in FIG. 8, a wiring pattern 150 having the thickness of about 15 micrometers is formed by the electrolytic copper plating treatment.

Figure 9:
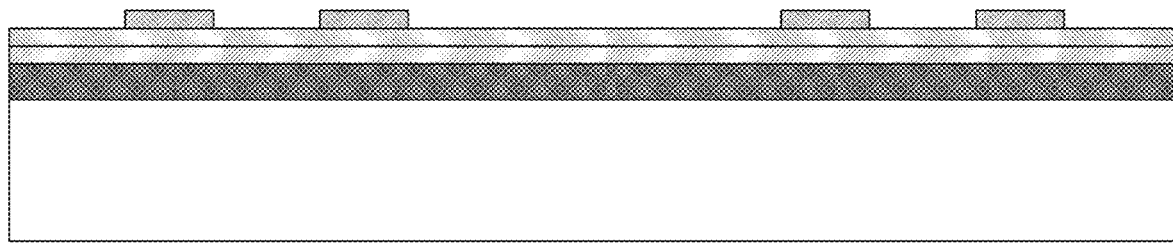
FIG. 9 is second views illustrating an example of steps of manufacturing the substrate 100 according to the embodiment of the present technology.
Figure 9:
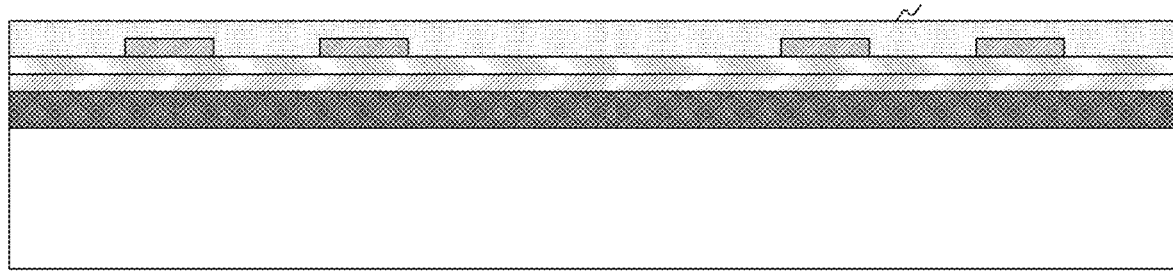
Figure 9:
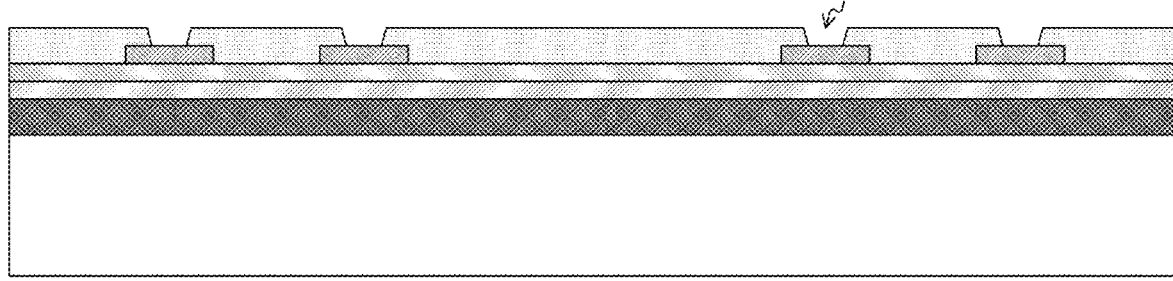
Figure 9:
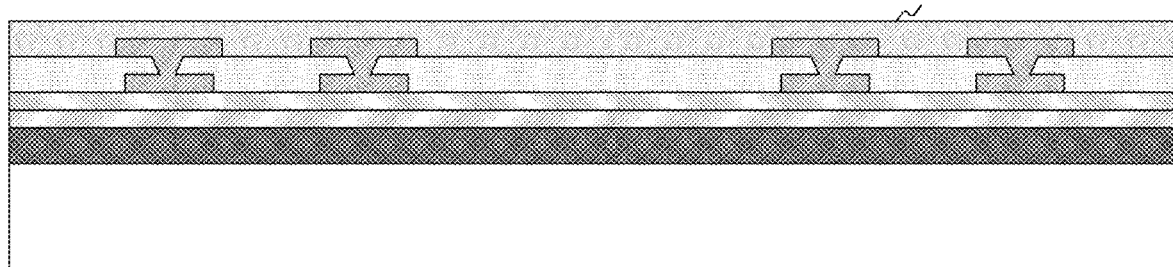

Next, as illustrated by e in FIG. 9, the plating resist is peeled off. Then, as pretreatment for forming an interlayer insulating resin, the surface of the wiring pattern is roughened to improve adhesiveness between the interlayer insulating resin and the wiring pattern. Note that the roughening treatment can be performed by blackening treatment by oxidation-reduction treatment or hydrogen peroxide-sulfuric acid-based soft etching treatment.

Next, as illustrated in f in FIG. 9, an interlayer insulating resin 161 is thermally bonded by roll laminating or laminating press on the wiring pattern. For example, an epoxy resin having the thickness of 45 micrometers is rolled and laminated. In a case of using a glass epoxy resin, copper foils having an arbitrary thickness are laminated and thermally compressed by laminating press. As the resin material of the interlayer insulating resin 161, an organic resin such as an epoxy resin, a polyimide resin, a PPE resin, a phenol resin, a PTFE resin, a silicon resin, a polybutadiene resin, a polyester resin, a melamine resin, a urea resin, a PPS resin, or a PPO resin can be used. Furthermore, each of these resins can be used alone, or a combination of resins by mixing a plurality of the resins or preparing a compound can also be used, for example. Moreover, an interlayer insulating resin obtained by including an inorganic filler in these materials or mixing a glass fiber reinforcing material can also be used.

Next, as illustrated in g in FIG. 9, a via hole for interlayer electrical connection is formed by a laser method or a photoetching method. In the case where the interlayer insulating resin 161 is a thermosetting resin, the via hole is formed by the laser method. As laser light, an ultraviolet laser such as a harmonic YAG laser or an excimer laser, or an infrared laser such as a carbon dioxide gas laser can be used. Note that, in the case of forming the via hole using the laser light, a thin resin film may remain on a bottom of the via hole, so desmear treatment is performed. In the desmear treatment, the resin is swollen with a strong alkali, and the resin is decomposed and removed by using an oxidizing agent such as a chromic acid or a permanganate aqueous solution. Furthermore, the resin may be removed by plasma treatment or sandblast treatment with an abrasive. In the case where the interlayer insulating resin 161 is a photosensitive resin, a via hole 170 is formed by a photoetching method. That is, the via hole 170 is formed by exposing the interlayer insulating resin 161 using ultraviolet rays through a mask and then performing development.

Next, after roughening treatment, electroless plating treatment is performed on a wall surface of the via hole 170 and a surface of the interlayer insulating resin 161. Next, a photosensitive resist is attached by roll laminating to the surface of the interlayer insulating resin 161 to which the electroless plating treatment has been applied. As the photosensitive resist in this case, for example, a dry film photosensitive plating resist film can be used. This photosensitive plating resist film is exposed and then developed to form a plating resist pattern in which the via hole 170 and the wiring pattern are opened. Next, the electrolytic copper plating treatment with the thickness of 15 micrometers is applied to the opening in the plating resist pattern. Next, the plating resist is peeled off, and the electroless plating remaining on the interlayer insulating resin is removed by hydrogen peroxide-sulfuric acid-based flash etching or the like, whereby the via hole 170 filled with copper plating and the wiring pattern, as illustrated in h in FIG. 9, are formed. Then, a similar step of roughening the wiring pattern and a similar step of forming an interlayer insulating resin 162 are repeatedly performed.

Figure 10:
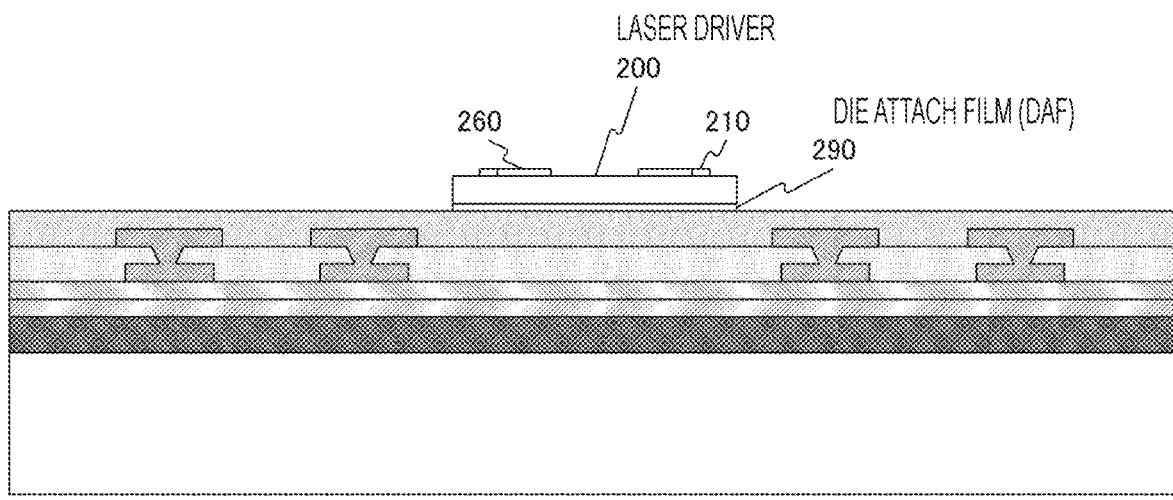
FIG. 10 is third views illustrating an example of steps of manufacturing the substrate 100 according to the embodiment of the present technology.
Figure 10:
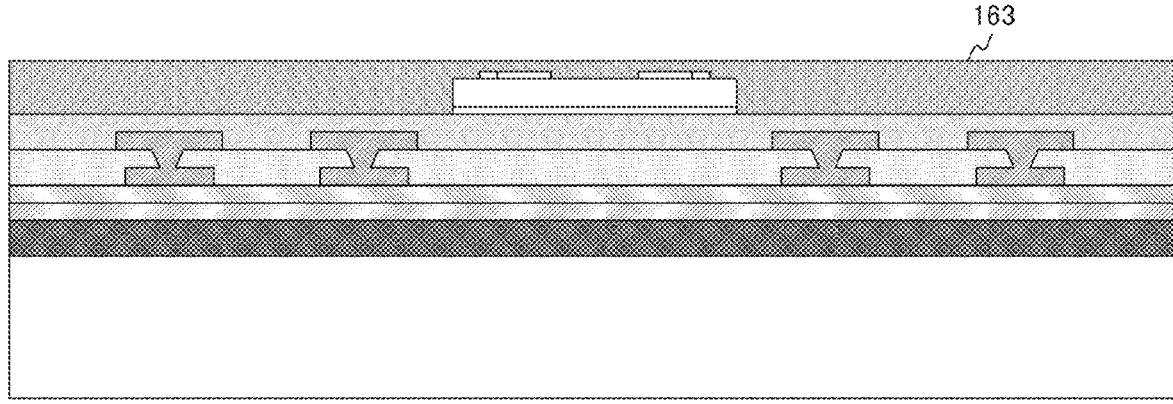
Figure 10:
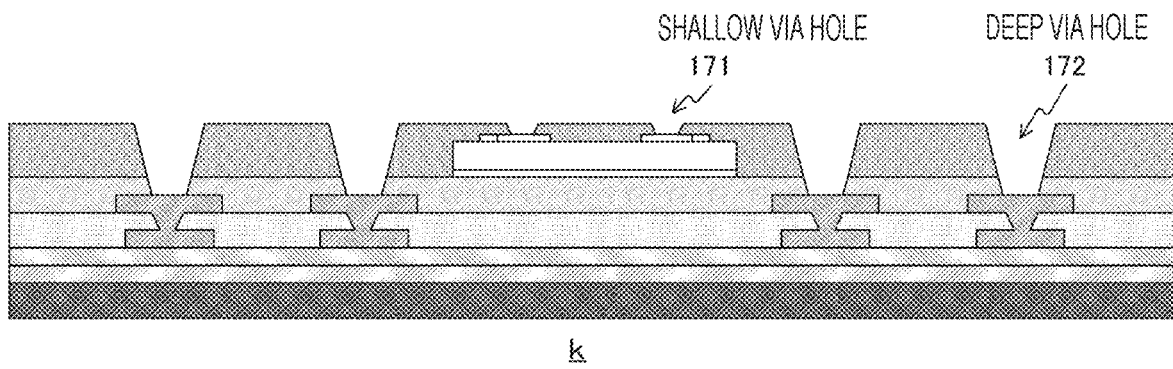

Next, as illustrated in i in FIG. 10, the laser driver 200 obtained by attaching the copper land and the copper wiring layer thinned to the thickness of about 30 to 50 micrometers to a die attach film (DAF) 290 are mounted in a face-up state.

Next, as illustrated in j in FIG. 10, an interlayer insulating resin 163 is thermally bonded by roll laminating or laminating press.

Figure 11:
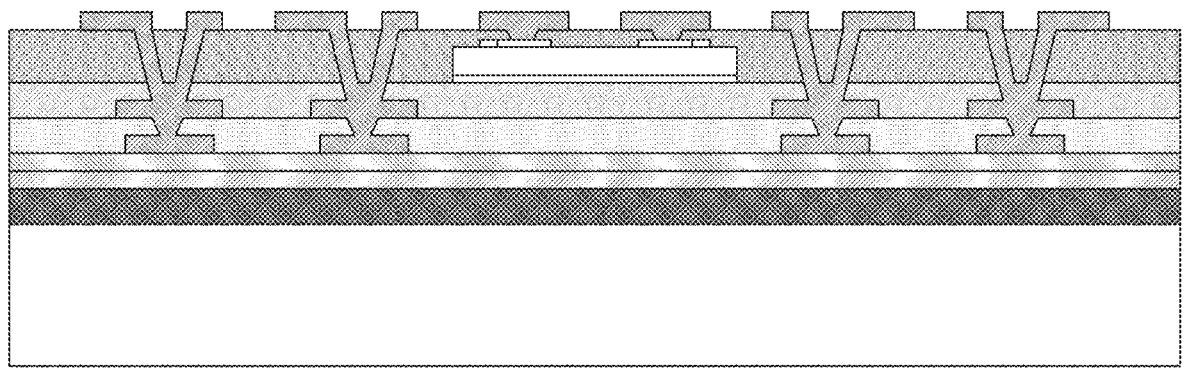
FIG. 11 is fourth views illustrating an example of steps of manufacturing the substrate 100 according to the embodiment of the present technology.
Figure 11:
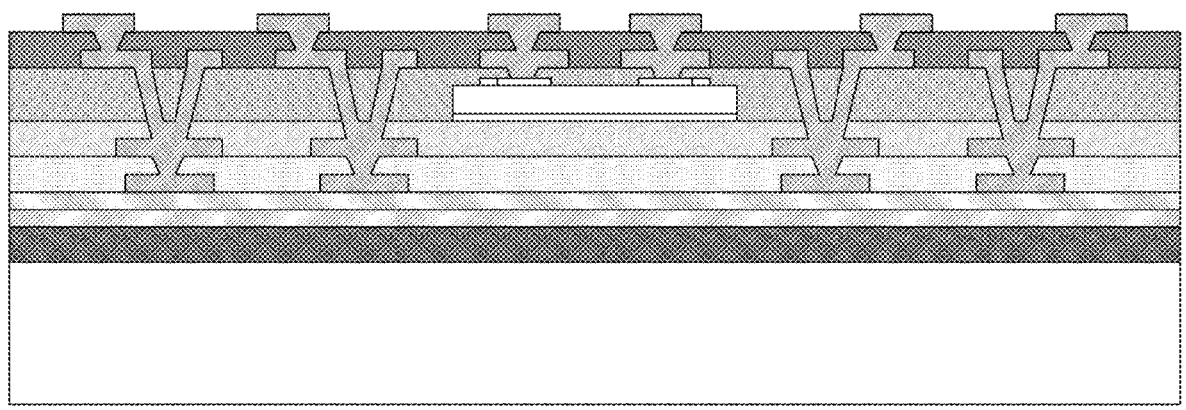
Figure 11:
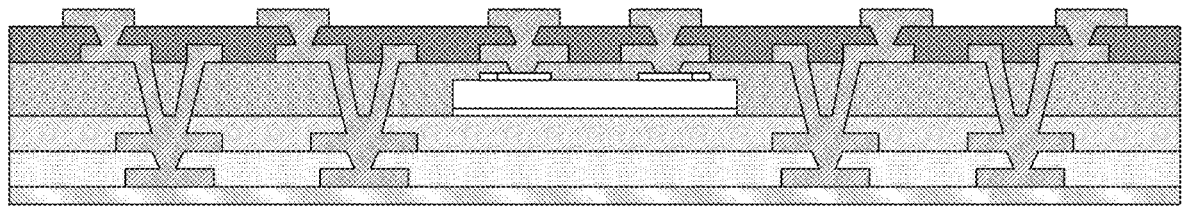

Next, as illustrated in k in FIG. 10 and in l in FIG. 11, via hole treatment, desmear treatment, roughening treatment, electroless plating treatment, and electrolytic plating treatment similar to the above are performed. Note that processing for a shallow via hole 171 in the copper land of the laser driver 200, processing for a deep via hole 172 in one lower level, the desmear treatment, and the roughening treatment are simultaneously performed.

Here, the shallow via hole 171 is a filled via filled with copper plating. The size and depth of each via are about 20 to 30 micrometers. Furthermore, the size of the land is about 60 to 80 micrometers in diameter.

Meanwhile, the deep via hole 172 is a so-called conformal via having copper plating applied only to an outside of the via. The size and depth of each via are about 80 to 150 micrometers. Furthermore, the size of the land is about 150 to 200 micrometers in diameter. Note that the deep via hole 172 is desirably arranged at a distance of about 100 micrometers from an outer shape of the laser driver 200 via an insulating resin.

Next, as illustrated in m in FIG. 11, an interlayer insulating resin similar to the above is thermally bonded by roll laminating or laminating press. At this time, the inside of the conformal via is filled with the interlayer insulating resin. Next, via hole treatment, desmear treatment, roughening treatment, electroless plating treatment, and electrolytic plating treatment similar to the above are performed.

Next, as illustrated in n in FIG. 11, the support plate 110 is separated by being peeled from an interface between the carrier copper foil 131 of the peelable copper foil 130 and the ultra-thin copper foil 132.

Figure 12:
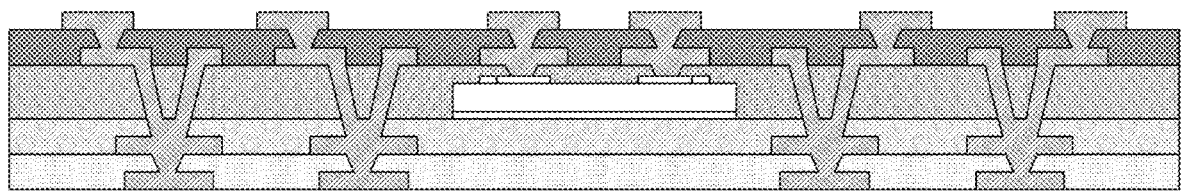
FIG. 12 is fifth views illustrating an example of steps of manufacturing the substrate 100 according to the embodiment of the present technology.
Figure 12:
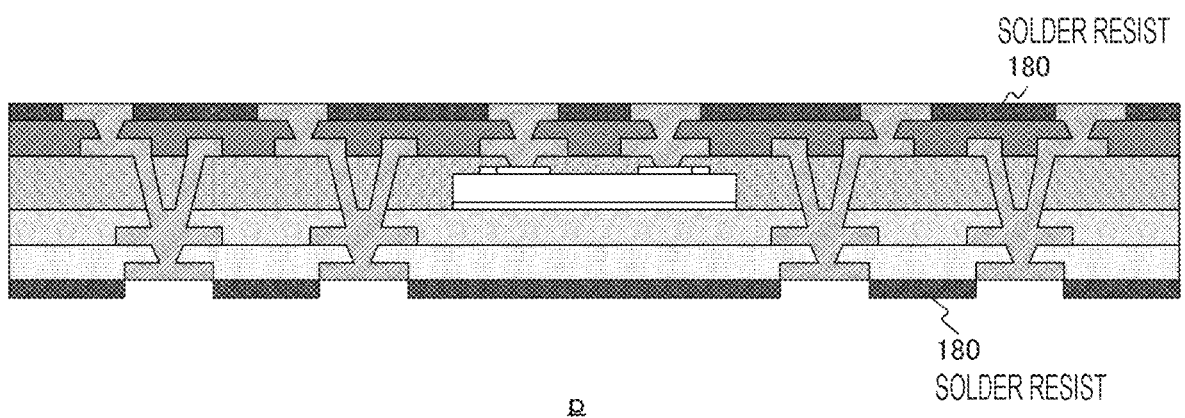
Figure 12:
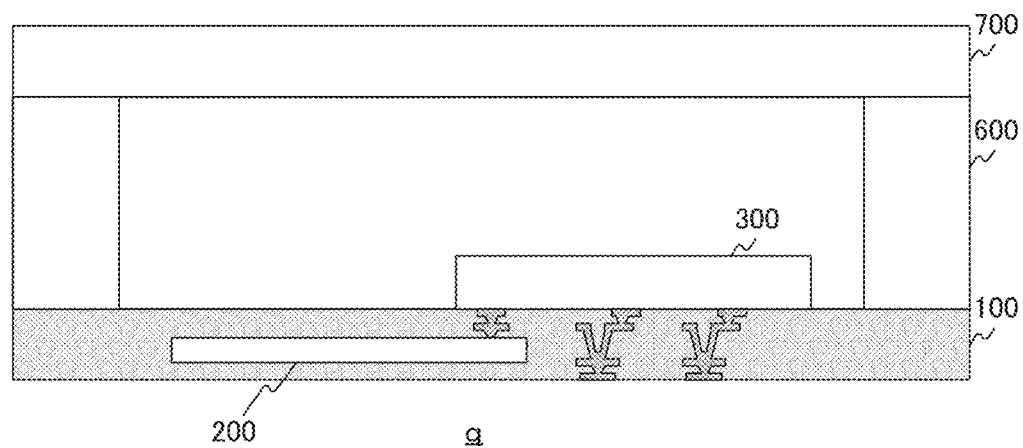

Next, as illustrated in o in FIG. 12, the ultra-thin copper foil 132 and the plating base conductive layer are removed using sulfuric acid-hydrogen peroxide-based soft etching, whereby a substrate having components built-in with an exposed wiring pattern can be obtained.

Next, as illustrated in p in FIG. 12, a solder resist 180 having a pattern having an opening in a land portion of the wiring pattern is printed on the exposed wiring pattern. Note that the solder resist 180 can be formed by a roll coater using a film type. Next, electroless Ni plating is formed on the land portion of the opening of the solder resist 180 in the thickness of 3 micrometers or more, and electroless Au plating is formed on the electroless Ni plating in the thickness of 0.03 micrometers or more. The electroless Au plating may be formed in the thickness of 1 micrometer or more. Moreover, the electroless Au plating may be precoated with a solder. Alternatively, electrolytic Ni plating may be formed in the opening of the solder resist 180 in the thickness of 3 micrometers or more, and electrolytic Au plating may be formed on the electrolytic Ni plating in the thickness of 0.5 micrometers or more. Moreover, an organic rustproof film may be formed in the opening of the solder resist 180, other than metal plating.

Alternatively, a cream solder may be applied and printed to mount a solder ball grid array (BGA) as a connection terminal on the land for external connection. Furthermore, as the connection terminal, a copper core ball, a copper pillar bump, a land grid array (LGA), or the like may be used.

The semiconductor laser 300, the photodiode 400, and the passive component 500 are mounted and the side wall 600 and the diffusion plate 700 are attached to the surface of the substrate 100 manufactured as described above, as illustrated in q in FIG. 12. In general, after the manufacturing is performed as a collective substrate, an outer shape is processed by a dicer or the like to be separated into individual pieces.

Note that, in the above-described steps, an example of using the peelable copper foil 130 and the support plate 110 has been described. A copper clad laminate (CCL) can be used instead of the peelable copper foil 130 and the support plate 110. Furthermore, as the manufacturing method incorporating the components into the substrate, a method of forming a cavity in the substrate and mounting the components may be used.

As described above, according to the embodiment of the present technology, the electrical connection between the semiconductor laser 300 and the laser driver 200 is performed via the connection via 101, whereby the wiring inductance can be reduced. Specifically, the wiring length between the electrical connection between the semiconductor laser 300 and the laser driver 200 is set to 0.5 millimeters or less, whereby the wiring inductance can be set to 0.5 nanohenries or less. Furthermore, the overlap amount between the semiconductor laser 300 and the laser driver 200 is set to 50% or less, whereby a certain number of thermal vias 102 can be arranged immediately below the semiconductor laser 300, and favorable heat dissipation characteristics can be obtained.

2. Application

Electronic Device

Figure 13:
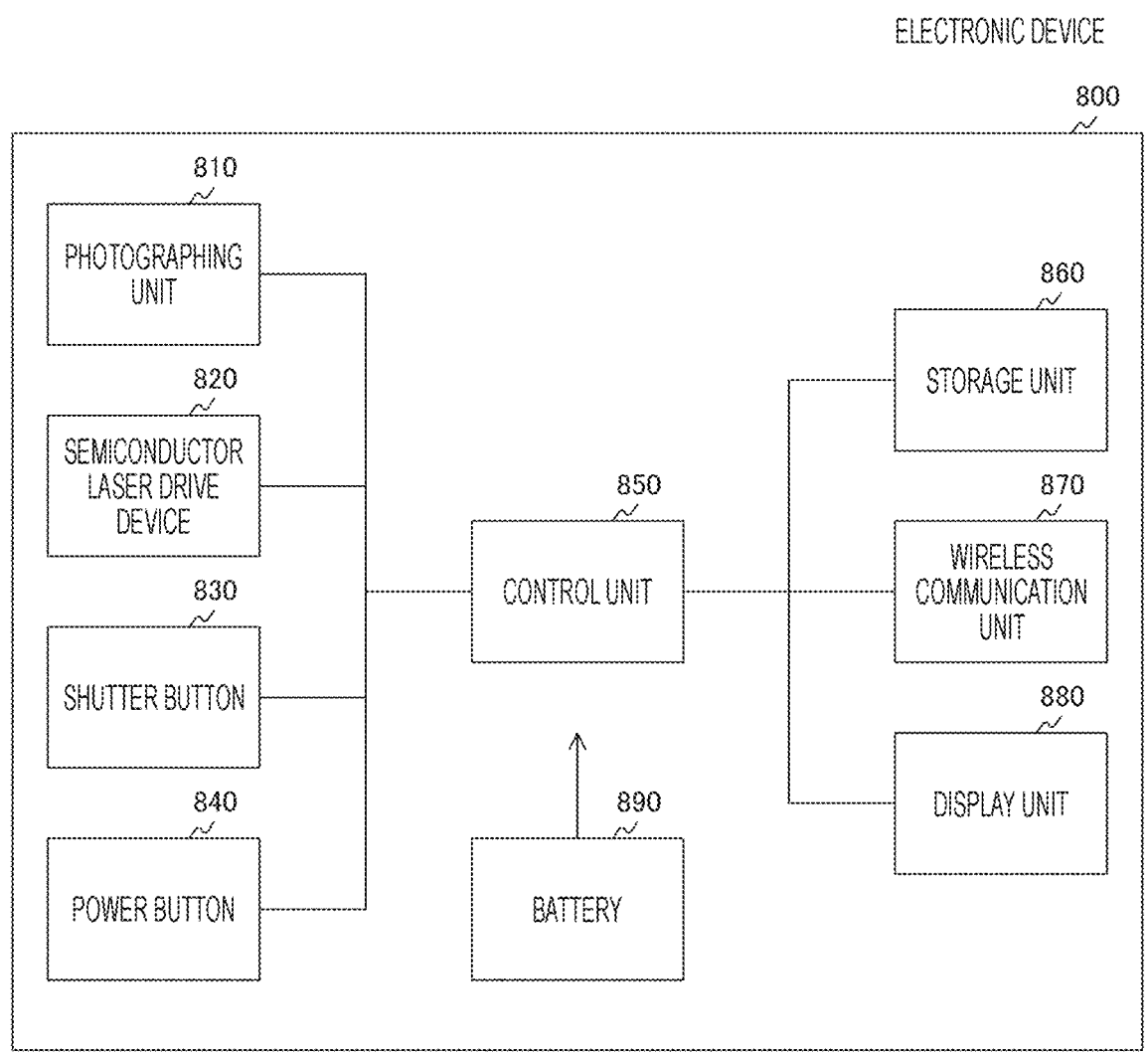
FIG. 13 is a diagram illustrating a system configuration example of an electronic device 800 as an application of the embodiment of the present technology.

FIG. 13 is a diagram illustrating a system configuration example of an electronic device 800 as an application of the embodiment of the present technology.

The electronic device 800 is a mobile terminal equipped with the semiconductor laser drive device 10 according to the above-described embodiment. The electronic device 800 includes an imaging unit 810, a semiconductor laser drive device 820, a shutter button 830, a power button 840, a control unit 850, a storage unit 860, a wireless communication unit 870, a display unit 880, and a battery 890.

The imaging unit 810 is an image sensor that captures an image of an object. The semiconductor laser drive device 820 is the semiconductor laser drive device 10 according to the above-described embodiment.

The shutter button 830 is a button for giving an instruction on imaging timing of the imaging unit 810 from an outside of the electronic device 800. The power button 840 is a button for giving an instruction on on/off of power of the electronic device 800 from the outside of the electronic device 800.

The control unit 850 is a processing unit that controls the entire electronic device 800. The storage unit 860 is a memory that stores data and programs necessary for operation of the electronic device 800. The wireless communication unit 870 performs wireless communication with the outside of the electronic device 800. The display unit 880 is a display that displays images and the like. The battery 890 is a power supply source that supplies power to each unit of the electronic device 800.

A specific phase (for example, rising timing) of a light emission control signal for controlling the imaging unit 810 and the semiconductor laser drive device 820 is set to 0 degrees, and a light receiving amount from 0 degrees to 180 degrees is detected as Q1, and the light receiving amount from 180 degrees to 360 degrees is detected as Q2. Furthermore, the imaging unit 810 detects the light receiving amount from 90 degrees to 270 degrees as Q3, and detects the light receiving amount from 270 degrees to 90 degrees as Q4. The control unit 850 calculates a distance d to the object from these light receiving amounts Q1 to Q4 by the following expression, and displays the distance d on the display unit 880.

$$d=(c/4\pi f)\times \arctan\{(Q3-Q4)/(Q1-Q2)\}$$

In the above expression, the unit of the distance d is, for example, meter (m). c represents a light speed, and the unit of the light speed is, for example, meter per second (m/s). arctan is an inverse function of a tangent function. The value of "(Q3−Q4)/(Q1−Q2)" indicates a phase difference between irradiation light and reflected light. π represents pi. Furthermore, f represents a frequency of the irradiation light, and its unit is, for example, megahertz (MHz).

Figure 14:
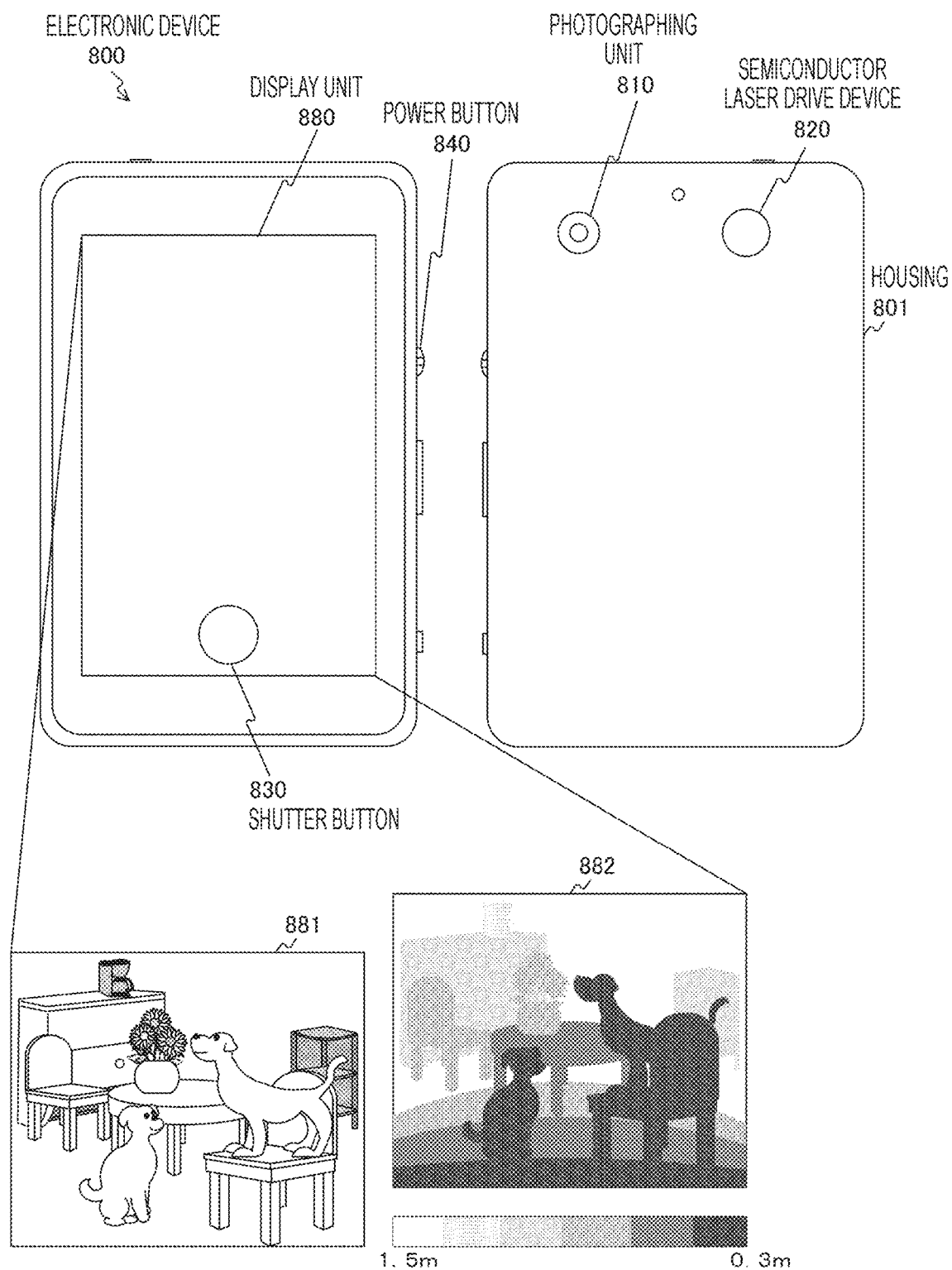
FIG. 14 is a view illustrating an external configuration example of the electronic device 800 as an application of the embodiment of the present technology.

FIG. 14 is a view illustrating an external configuration example of the electronic device 800 as an application of the embodiment of the present technology.

The electronic device 800 is housed in a housing 801 and includes the power button 840 on a side surface and the display unit 880 and the shutter button 830 on a surface. Furthermore, optical regions of the imaging unit 810 and the semiconductor laser drive device 820 are provided on a back surface.

As a result, the display unit 880 can display not only a normal captured image 881 but also a depth image 882 according to a distance measurement result using ToF.

Note that, in this application example, a mobile terminal such as a smartphone has been illustrated as the electronic device 800, but the electronic device 800 is not limited to the example and may be a digital camera, a game machine, a wearable device, or the like, for example.

Note that the above-described embodiments describe an example for embodying the present technology, and the matters in the embodiments and the matters used to specify the invention in the claims have correspondence, respectively. Similarly, the matters used to specify the invention in the claims and the matters in the embodiment of the present technology given the same names have correspondence, respectively. However, the present technology is not limited to the embodiments, and can be embodied by application of various modifications to the embodiments without departing from the gist of the present technology.

Note that the effects described in the present specification are merely examples and are not limited, and other effects may be exhibited.

Note that the present technology can also have the following configurations.

(1) A semiconductor laser drive device including:
a substrate having a laser driver built-in;
a semiconductor laser mounted on one surface of the substrate; and
connection wiring configured to electrically connect the laser driver and the semiconductor laser by a wiring inductance of 0.5 nanohenries or less.

(2) The semiconductor laser drive device according to (1), in which
the connection wiring has a length of 0.5 millimeters or less.

(3) The semiconductor laser drive device according to (1) or (2), in which the connection wiring is provided via a connection via provided in the substrate.

(4) The semiconductor laser drive device according to any one of (1) to (3), in which
a part of the semiconductor laser is arranged over the laser driver.

(5) The semiconductor laser drive device according to (4), in which
a part of the semiconductor laser, the part having an area of 50% or less of the semiconductor laser, is arranged over the laser driver.

(6) The semiconductor laser drive device according to any one of (1) to (5), in which
the substrate includes a thermal via at a position where the semiconductor laser is mounted.

(7) The semiconductor laser drive device according to any one of (1) to (6), further including:
an outer wall surrounding a region including the semiconductor laser in the one surface of the substrate; and
a diffusion plate covering an upper region of the region surrounded by the outer wall.

(8) The semiconductor laser drive device according to any one of (1) to (7), further including:
a photodiode mounted on the one surface of the substrate and configured to monitor light intensity of laser light emitted from the semiconductor laser.

(9) The semiconductor laser drive device according to any one of (1) to (8), further including:
a connection terminal to be connected with an outside on an opposite surface of the one surface of the substrate.

(10) The semiconductor laser drive device according (9), in which
the connection terminal is formed by at least one of a solder ball, a copper core ball, a copper pillar bump, or a land grid array.

(11) An electronic device including:
a substrate having a laser driver built-in;
a semiconductor laser mounted on one surface of the substrate; and
connection wiring configured to electrically connect the laser driver and the semiconductor laser by a wiring inductance of 0.5 nanohenries or less.

(12) A method of manufacturing a semiconductor laser drive device, the method including:
a procedure of forming a laser driver on an upper surface of a support plate;
a procedure of forming connection wiring of the laser driver to form a substrate having the laser driver built-in; and
a procedure of mounting a semiconductor laser on one surface of the substrate and forming connection wiring that electrically connects the laser driver and the semiconductor laser by a wiring inductance of 0.5 nanohenries or less via the connection wiring.

REFERENCE SIGNS LIST

10, 820 Semiconductor laser drive device
100 Substrate
101 Connection via
102 Thermal via
110 Support plate
120 Adhesive resin layer
130 Peelable copper foil
131 Carrier copper foil
132 Ultra-thin copper foil
140, 180 Solder resist 150 Wiring pattern
161 to 163 Interlayer insulating resin
170 to 172 Via hole
200 Laser driver
210 I/O pad
220 Protective insulating layer
230 Surface protective film
240 Adhesion layer/seed layer
250 Photoresist
260 Copper land and copper wiring layer (RDL)
290 Die attach film (DAF)
300 Semiconductor laser
400 Photodiode
500 Passive component
600 Side wall
700 Diffusion plate
800 Electronic device
801 Housing
810 Imaging unit
830 Shutter button
840 Power button
850 Control unit
860 Storage unit
870 Wireless communication unit
880 Display unit
890 Battery

What is claimed is:

1. A semiconductor laser drive device, comprising:
a substrate having a laser driver built-in;
a semiconductor laser mounted on one surface of the substrate, wherein a first surface of the semiconductor laser faces the one surface of the substrate;
connection wiring configured to electrically connect the laser driver and the semiconductor laser; and
a thermal via, wherein the thermal via is disposed between the laser drive and the semiconductor laser, and wherein the thermal via extends from the first surface of the semiconductor laser, through the substrate, and to a surface opposite the one surface of the substrate.

2. The semiconductor laser drive device according to claim 1, wherein
the connection wiring has a length of 0.5 millimeters or less.

3. The semiconductor laser drive device according to claim 1, wherein
the connection wiring includes a connection via provided in the substrate.

4. The semiconductor laser drive device according to claim 1, wherein
a part of the semiconductor laser is arranged over the laser driver.

5. The semiconductor laser drive device according to claim 4, wherein
a part of the semiconductor laser having an area of 50% or less of the semiconductor laser, is arranged over the laser driver.

6. The semiconductor laser drive device according to claim 1, wherein
the substrate includes a plurality of thermal vias at a position where the semiconductor laser is mounted.

7. The semiconductor laser drive device according to claim 1, further comprising:
an outer wall surrounding a region including the semiconductor laser in the one surface of the substrate; and
a diffusion plate covering an upper region of the region surrounded by the outer wall.

8. The semiconductor laser drive device according to claim 1, further comprising:
a photodiode mounted on the one surface of the substrate and configured to monitor light intensity of laser light emitted from the semiconductor laser.

9. The semiconductor laser drive device according to claim 1, further comprising:
a connection terminal on the surface opposite the one surface of the substrate.

10. The semiconductor laser drive device according to claim 9, wherein
the connection terminal is formed by at least one of a solder ball, a copper core ball, a copper pillar bump, or a land grid array.

11. An electronic device, comprising:
a substrate having a laser driver built-in;
a semiconductor laser mounted on one surface of the substrate;
connection wiring configured to electrically connect the laser driver and the semiconductor laser,
wherein the semiconductor laser and the laser driver overlap one another, and
wherein the connection wiring is a via that extends through the substrate, between the laser driver and the semiconductor laser, and within an area of overlap between the semiconductor laser and the laser driver; and
a thermal via, wherein the thermal is disposed between the laser driver and the semiconductor laser, and wherein the thermal via extends from a first surface of the semiconductor laser, through the substrate, and to a surface opposite the one surface of the substrate.

12. A method of manufacturing a semiconductor laser drive device, the method comprising:
a procedure of forming a laser driver on an upper surface of a support plate;
a procedure of forming connection wiring of the laser driver to form a substrate having the laser driver built-in; and
a procedure of mounting a semiconductor laser on one surface of the substrate, forming connection wiring that electrically connects the laser driver and the semiconductor laser, and forming a thermal via,
wherein the semiconductor laser and the laser driver overlap one another,
wherein the connection wiring is a via that extends through the substrate, between the laser driver and the semiconductor laser, and within an area of overlap between the semiconductor laser and the laser driver, and
wherein the thermal via is disposed between the laser drive and the semiconductor laser, and wherein the thermal via extends from a first surface of the semiconductor laser, through the substrate, and to a surface opposite the one surface of the substrate.

* * * * *